(12) United States Patent
Kuwajima et al.

(10) Patent No.: US 7,718,090 B2
(45) Date of Patent: May 18, 2010

(54) CONDUCTIVE PASTE

(75) Inventors: Hideji Kuwajima, Chikusei (JP);
Jun-ichi Kikuchi, Bangkok (TH);
Kuniaki Satou, Chikusei (JP)

(73) Assignee: Hitachi Chemical Co., Ltd., Tokyo (JP)

(*) Notice: Subject to any disclaimer, the term of this patent is extended or adjusted under 35 U.S.C. 154(b) by 505 days.

(21) Appl. No.: 10/543,918

(22) PCT Filed: Nov. 13, 2003

(86) PCT No.: PCT/JP03/14445
§ 371 (c)(1),
(2), (4) Date: Jul. 29, 2005

(87) PCT Pub. No.: WO2004/068506
PCT Pub. Date: Aug. 12, 2004

(65) Prior Publication Data
US 2006/0145125 A1    Jul. 6, 2006

(30) Foreign Application Priority Data
Jan. 29, 2003  (JP) .............................. 2003-020203

(51) Int. Cl.
*H01B 1/00* (2006.01)
*H01B 1/12* (2006.01)
*C09C 1/62* (2006.01)
(52) U.S. Cl. .................. 252/500; 106/403; 423/44; 516/97; 556/110
(58) Field of Classification Search .............. 252/500; 106/403; 423/44; 516/97; 556/110
See application file for complete search history.

(56) References Cited

U.S. PATENT DOCUMENTS 3,586,597 A *  6/1971  Okuhashi .................... 442/187
(Continued)

FOREIGN PATENT DOCUMENTS

JP         03272197      * 12/1991
(Continued)

OTHER PUBLICATIONS

Denshi Zairyo (Electronic Materials), Oct. 1994, pp. 42 to 46.
(Continued)

*Primary Examiner*—Anthony J Green
*Assistant Examiner*—Pegah Parvini
(74) *Attorney, Agent, or Firm*—Antonelli, Terry, Stout & Kraus, LLP.

(57) ABSTRACT

The present invention provides an electroconductive paste that can contain a high proportion of an electroconductive powder, has excellent electroconductivity reliability and migration resistance, has a highly competitive price due to a reduced amount of silver plating, and is suitable for use in solder electrode formation, an electroconductive adhesive, etc. The electroconductive paste of the present invention comprises a binder and an electroconductive powder containing 80 to 97 wt % of a substantially spherical silver-coated copper powder in which the surface of a copper powder is coated with silver and the surface thereof is further coated with 0.02 to 0.5 wt % relative to the copper powder of a fatty acid, and 3 to 20 wt % of a flat-shaped silver-coated copper powder in which the surface of a copper powder is coated with silver and the surface thereof is further coated with 0.02 to 1.2 wt % relative to the copper powder of a fatty acid.

15 Claims, 3 Drawing Sheets

U.S. PATENT DOCUMENTS

| | | | | |
|---|---|---|---|---|
| 4,705,647 | A | * | 11/1987 | Yamaguchi et al. .......... 252/512 |
| 5,011,627 | A | * | 4/1991 | Lutz et al. ................... 252/512 |
| 5,372,749 | A | * | 12/1994 | Li et al. ...................... 252/512 |
| 5,766,739 | A | * | 6/1998 | Funaki et al. ................ 428/201 |
| 5,976,418 | A | * | 11/1999 | Fuller et al. ................. 252/500 |
| 6,165,386 | A | * | 12/2000 | Endo et al. .................. 252/500 |
| 2002/0149005 | A1 | * | 10/2002 | Khattar et al. .............. 252/500 |
| 2004/0248006 | A1 | * | 12/2004 | Tsutsumi et al. ............ 429/223 |

FOREIGN PATENT DOCUMENTS

| | | | |
|---|---|---|---|
| JP | 7-30216 | | 1/1995 |
| JP | 07-030219 | | 1/1995 |
| JP | 8-302196 | | 11/1996 |
| JP | 10-31912 | | 2/1998 |
| JP | 11-96833 | | 4/1999 |
| JP | 2000-82331 | | 3/2000 |
| JP | 2002-8444 | | 1/2002 |
| JP | 2002008444 | * | 1/2002 |
| JP | 2002-231050 | | 8/2002 |
| JP | 2002231050 | * | 8/2002 |
| JP | 2002-260443 | | 9/2002 |
| JP | 2002260443 | * | 9/2002 |
| JP | 2002-332501 | | 11/2002 |
| JP | 2002-332502 | | 11/2002 |
| JP | 2002332501 | * | 11/2002 |
| JP | 2003-45228 | | 2/2003 |
| JP | 2004-047422 | | 2/2004 |
| JP | 2004-47422 | | 2/2004 |
| TW | 392179 B | | 6/2000 |
| WO | WO 2004/068506 | | 8/2004 |

OTHER PUBLICATIONS

Taiwan Search Report, for Application No. 092132022, issued Feb. 1, 2007.

Official Action issued on May 25, 2007, in counterpart Chinese application 200380109308X.

Substantive Examination Report and Search Report issued on Jun. 20, 2007, in a counterpart application, in Malaysia, No. PI20034366.

Korean Official Action (Notice of Submission of Written Opinion), for Appln. No. 10-2005-7013823, dated Sep. 25, 2006.

Form PCT/IB/338, Notification of Transmittal of Translation of the International Preliminary Report on Patentability, for International Application No. PCT/JP2003/014445, mailed Sep. 29, 2005, 6 pp.

* cited by examiner

FIG. 3

CONDUCTIVE PASTE

TECHNICAL FIELD

The present invention relates to an electroconductive paste that is used in wiring board circuit formation, shield layer formation, electronic component electrode formation, solder electrode formation, an electroconductive adhesive, etc.

BACKGROUND ART

As one method for forming an electroconductive circuit on a printed wiring board, an electroconductive powder such as gold, silver, copper, or carbon is used, and this is mixed with a binder, an organic solvent, and, as necessary, an additive, etc. to form a paste (e.g., Denshi Zairyo (Electronic Materials), Oct. 1994, pp. 42 to 46). In particular, in a field in which high electroconductivity is required, a gold powder, a silver powder, a palladium powder, or an alloy powder thereof is generally used.

Among the above-mentioned pastes, because it has good electroconductivity an electroconductive paste containing a silver powder is used for formation of a printed wiring board, a wiring layer (an electroconductive layer) of an electronic component, etc., or formation of an electric circuit or an electrode of an electronic component, but when an electric field is applied thereto under conditions of high temperature and high humidity, electrodeposition of silver, which is called migration, occurs on the electric circuit or the electrode, thus causing a short circuit between electrodes or between wiring, which is a drawback. Several countermeasures against this migration have been taken, for example, coating the surface of a conductor with a moisture-proof coating or adding a corrosion inhibitor such as a nitrogen-containing compound to the electroconductive paste, but none thereof had a sufficient effect. Although migration resistance can be improved by use of a silver-palladium alloy powder instead of the silver powder, since silver and palladium are expensive, the silver-palladium alloy powder is also expensive, which is a drawback.

Furthermore, in order to obtain a conductor having favorable resistance, it is necessary to increase the amount of silver powder added, and since the silver powder is expensive, the electroconductive paste is correspondingly expensive, which is a drawback. Use of a silver-coated copper powder can improve the migration and also give an inexpensive electroconductive paste. However, when the surface of a copper powder is coated uniformly and thickly with silver, the effect in improving the migration is not sufficient. Moreover, a coating obtained from the electroconductive paste cannot be subjected to direct soldering, which is a drawback. Furthermore, when the electroconductive paste employing a silver powder is subjected to soldering, silver erosion occurs and a good joint cannot be obtained, which is a drawback.

On the other hand, a copper powder is used in some cases instead of the silver powder. However, after an electroconductive paste employing a copper powder is heated and cured, the copper is very susceptible to oxidation, and the copper powder reacts with oxygen contained in air or the binder, thus forming an oxide film on the surface thereof and thereby greatly degrading the electroconductivity. In order to overcome this, a copper paste having its electroconductivity stabilized by adding various types of reducing agent so as to prevent the oxidation of the surface of the copper powder has been disclosed, but the electroconductivity and the stability of the electroconductivity thereof are inferior to those of the silver paste, and the resistance thereof increases in a high temperature, high humidity test, etc., which is a drawback.

Furthermore, unless the content of the copper powder in the electroconductive paste is high, stable electroconductivity cannot be obtained. However, when the content of the copper powder is high, the adhesion might be degraded or the storage stability might be poor, which is a drawback. Moreover, the coating of the copper paste thus obtained cannot, with a conventional copper paste, be directly soldered onto, which is also a drawback.

Conventionally, when a known electroconductive paste is used as an adhesive, since electroconductive powders are expensive, the electroconductive paste is also expensive compared with a solder paste, which is a drawback. There is therefore a desire for an electroconductive adhesive that has a more reliable electroconductivity than that of the copper paste, has better migration resistance than that of the silver paste, and gives excellent workability for solder paste and for drying/curing.

Furthermore, since conventionally known electroconductive pastes cannot have solder directly applied thereon, a coating of the electroconductive paste is subjected to an activation treatment before carrying out electroless plating, or copper electroplating is carried out in a plating solution using the coating as a cathode and the copper coating obtained by plating is subsequently subjected to soldering. However, unless the bonding between the coating and the copper plating is reliable, it is not practical. Therefore, if an electroconductive paste that can have solder applied thereon without carrying out electroless plating or electroplating is developed, the circuit formation step can be greatly shortened, which is a major advantage.

A solder is easily joined to a metal but does not join to a binder. When soldering is carried out, a coating is ideally formed from an electroconductive powder alone, which is then subjected to soldering, but there is the problem that no coating can be formed from an electroconductive powder alone without a binder.

A binder is therefore used to form an electroconductive paste. However, there is a restriction on the amount of binder in order to achieve reliability and workability of coating formation; for example, if the proportion of the binder is high, the electroconductive powder, which is a metal, is covered with the binder, there can be no areas where the solder and the electroconductive powder are in contact with each other, the solder cannot therefore adhere, and the electroconductivity is degraded, which are drawbacks.

In order to form an electroconductive paste to which a solder can adhere, the composition should be as close as possible to that of a copper foil. That is, it is ideal for the paste to have a composition such that when the electroconductive powder is placed in a given space, the electroconductive powder is highly packed, and the binder occupies only the volume corresponding to gaps between the electroconductive powder particles.

However, when the proportion of the electroconductive powder is made high as described above, the viscosity of the electroconductive paste becomes extremely high, and it becomes difficult to prepare an electroconductive paste, the workability when applying the electroconductive paste is degraded, and since the amount of binder for combining the electroconductive powder particles is small, the strength of the coating is also degraded. Furthermore, when the paste is used as an electroconductive adhesive, since the adhesion is low, it is not suitable for that use. Moreover, when solder joining is carried out using the electroconductive paste, it is necessary to use an electroconductive paste having a good balance between soldering properties, electroconductivity, workability, strength, and cost.

When the electroconductive paste is used as a solder substitute material for the purpose of electroconductive adhesion, in addition to printability, adhesion, and reliable conductivity, the workability, that is, the paste being dried and cured in a short time, is also important. When drying and curing a solder substitute adhesive, it is preferable to use a reflow oven, which has been used by assembly manufacturers for soldering chip components, from the viewpoint of effective utilization of equipment. In the case of general silver pastes, there is the defect that drying and curing at high temperature for a short time in a solder reflow oven easily causes swelling. Copper pastes also have the defects that curing at high temperature for a short time does not give stable electroconductivity, and in reliability tests such as a constant temperature, constant humidity test and a gas-phase cooling and heating test, the so-called open circuit, that is, loss of conduction, is observed.

Figure 1:
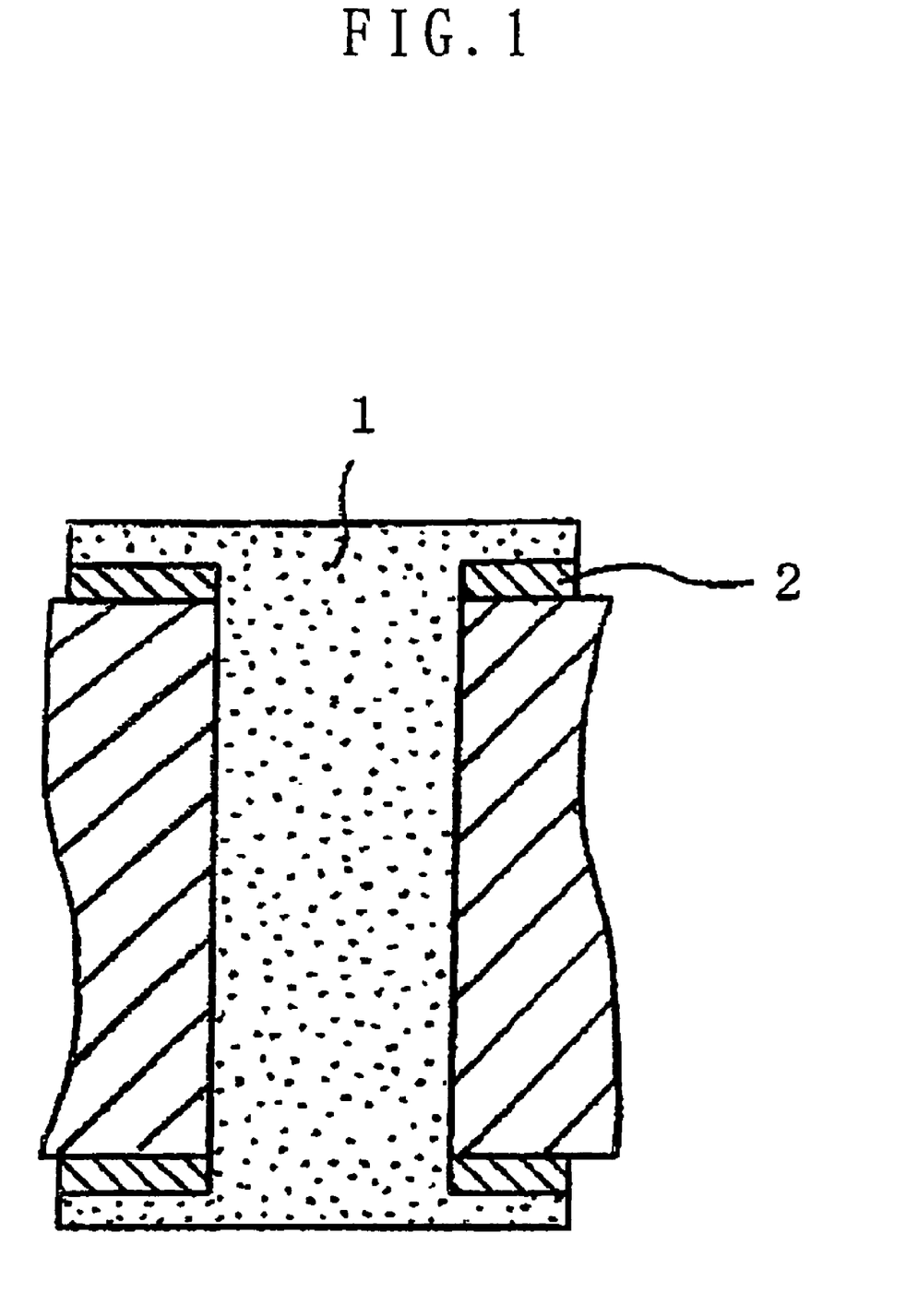
FIG. 1 is a cross sectional view showing a state in which a through hole is connected by means of an electroconductive paste.

An electroconductive paste is used in a method for forming an electroconductive layer as shown in FIG. 1 by dispersing an electroconductive powder in a binder to form an electroconductive paste, and coating the surface of a substrate with the electroconductive paste or filling a through hole therewith. In FIG. 1, 1 denotes the electroconductive paste and 2 denotes a copper foil.

With regard to another means for forming an electroconductive layer in a through hole formed in a printed wiring board, there is a method for forming an electroconductive layer by subjecting the inner wall of the through hole to copper plating.

When a hole-filling electroconductive paste for filling a through hole is employed connection between layers generally requires high electroconductivity even though the hole is small, and it is therefore necessary to pack the hole with the electroconductive paste as tightly as possible, and embed the electroconductive paste in the hole without any gaps. Conventional hole-filling electroconductive pastes are therefore required to have a high proportion of electroconductive powder, but when the proportion of electroconductive powder is made high, the viscosity of the electroconductive paste increases, and the hole packing properties thereof are degraded. Conversely, when the proportion of binder is made high, the viscosity decreases and the hole packing properties are therefore improved, but the electroconductivity is degraded, which is a drawback.

As a countermeasure thereagainst, a solvent-free type of electroconductive paste containing no solvent and employing as a main component of the binder a liquid epoxy resin is used, or an electroconductive paste is used that contains, depending on the hole size, a small amount of solvent.

However, since the epoxy resin shrinks less due to heat curing than a phenolic resin does, it is difficult to lower the resistance of the electroconductive paste containing the epoxy resin as a main component, which is a drawback.

Although the resistance can be reduced by increasing the proportion of electroconductive powder in the electroconductive paste or by using a metal powder having high electroconductivity such as silver, the resulting electroconductive paste is expensive.

On the other hand, there is an electroconductive paste containing a phenolic resin as a main component, and although this electroconductive paste has better electroconductivity than that of the electroconductive paste containing the epoxy resin as a main component, the viscosity of the electroconductive paste is high and there is a problem in terms of the hole packing properties.

Figure 2:
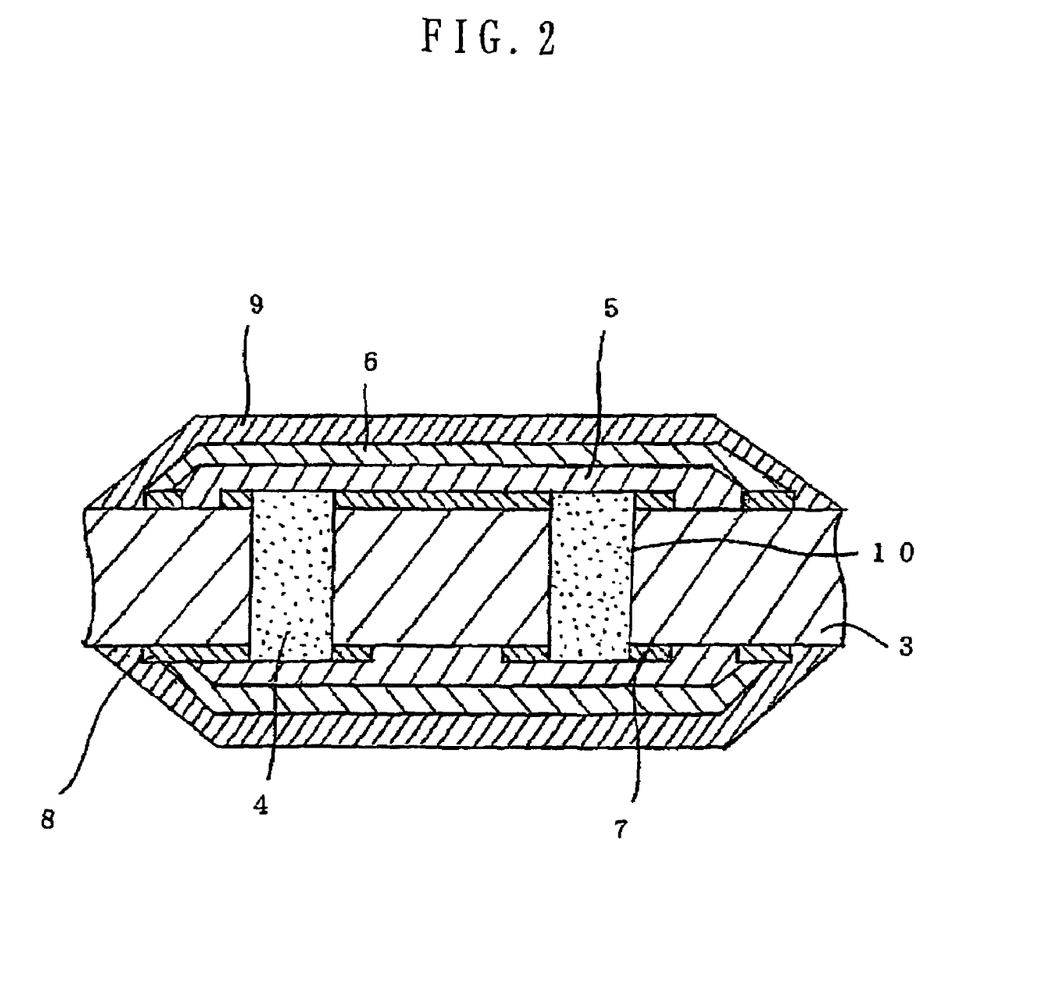
FIG. 2 is a cross sectional view of a conventional through hole wiring board.

When an electroconductive layer is formed within a through hole using the electroconductive paste, if the electroconductive paste used for filling the through hole contains a large amount of solvent, voids are inevitably formed within the through hole during drying of the solvent. The voids are a drawback for a multilayer circuit board as shown in FIG. 2 in which an insulating layer 5 is formed on the surface of a substrate 3, an end portion of the through hole filled with the electroconductive paste, a copper foil land 7, and part of a copper foil circuit 8, and an electroconductive material printed circuit (hereinafter, called a printed circuit) is further formed on the insulating layer 5 using an electroconductive material (jumper electroconductive paste), and it is necessary to eliminate any voids within a through hole 10, thereby improving the connection reliability between the through hole 10, the copper foil land 7, the copper foil circuit 8, and the printed circuit. In FIG. 2, 4 denotes an electroconductive layer, 6 denotes a jumper circuit, and 9 denotes an overcoat layer.

When a multilayer circuit board is fabricated by making a through hole conduct by means of copper plating formed on the inner wall of the through hole, after the inner wall of the through hole is subjected to copper plating, by applying cap plating over the electroconductive paste with which the through hole is filled, the above-mentioned drawbacks can be eliminated, but the number of steps increases and the cost also increases, which is undesirable.

There is also a method in which the inner wall of a through hole is subjected to copper plating so as to form an electroconductive layer, and the cavity is filled with a resin, and this method also has the defect that the number of steps increases and the cost is thus high.

There is also a method in which a through hole is filled with a voidless or substantially voidless electroconductive material so as to ensure conduction of the through hole, and an insulating layer and a printed circuit are then formed on the surface of a substrate. In this method, since the electroconductive material with which the through hole is filled and a copper foil land portion are connected to each other via the cross section of an end portion of the copper foil, there is the defect that the reliability of the connection is low. In order to eliminate this defect, the above-mentioned cap plating may be carried out, but this increases the number of steps and the cost, which is undesirable.

When a multilayer circuit board is fabricated by using a silver through hole wiring board in which a through hole is filled with a silver electroconductive material (silver paste) containing a solvent at 15 wt % or more and forming an insulating layer and a printed circuit on the surface of this wiring board, a large cavity is formed within the through hole accompanying evaporation of the solvent, resulting in a decrease in the reliability. That is, when an ionic impurity remains within the void during a washing step, etc., the migration resistance is degraded. Furthermore, in the case of the silver through hole wiring board, the silver paste might be thickly built up on a copper foil land, and the height of this thick, built up silver paste might obstruct the mounting of components.

On the other hand, there is a soldering material containing lead as a main component, and such a soldering material has been widely put into practice for a long time because it has a comparatively low melting point and good workability.

However, recently, restrictions on the use of lead have been proposed since lead is highly toxic and the human body and the ecosystem might be easily affected when a lead-containing effluent is treated. At present, a low melting point metal brazing material employing, as a substitute for lead, a metal material having a comparatively low melting point such as bismuth is being developed, but since the melting point thereof is higher than that of lead solder, it is necessary to increase the heat resistance of the substrate material, electronic components to be mounted, etc., giving rise to the defects of technical difficulty, an increase in cost, etc.

A multilayer lamination step employing a standard hole-filling electroconductive paste involves filling a hole with the electroconductive paste, laminating a pre-dried build-up layer, and applying heat and pressure as the main drying. It is therefore necessary that the electroconductive paste is cured after the main drying, and it is also necessary that the electroconductivity is improved by the application of pressure after lamination compared with a case where pressure is not applied.

However, the conventional hole-filling electroconductive paste employs an epoxy resin as a main component of the binder, and generally uses an imidazole as a curing agent therefor, and when a substantially spherical silver-coated copper powder that has been subjected to a dispersion treatment to break up aggregates and has copper exposed on the surface thereof is used as an electroconductive powder, the curing properties of the electroconductive paste might be degraded, which is a drawback.

When a silver-coated copper powder that has been subjected to a dispersion treatment is used, it is necessary to add a material that does not form a chelating bond with copper and functions as a curing agent for an epoxy resin.

Furthermore, since the substantially spherical silver-coated copper powder easily aggregates in a silver plating step and has a low tap density, if a large proportion thereof is added to the electroconductive paste, the viscosity of the paste is undesirably increased.

Moreover, when the substantially spherical silver-coated copper powder that has been subjected to the dispersion treatment is used, since a resol type phenolic resin forms a chelating bond with the copper, the viscosity of the electroconductive paste increases during storage, which is a drawback.

Furthermore, when an electroconductive adhesive (electroconductive paste) is prepared using an alkoxy group-containing resol type phenolic resin and an epoxy resin as binders, if a problem occurs in a component that is bonded to a printed wiring board and the bonded component is replaced, it is necessary to heat the cured thermosetting resins to a high temperature so that they are in a rubbery state, and such a defect can be eliminated by the use of a thermoplastic resin as the binder.

The present invention provides an electroconductive paste that can contain a high proportion of an electroconductive powder, has excellent electroconductivity reliability and migration resistance, has a highly competitive price due to a reduced amount of silver plating, and is suitable for use in solder electrode formation, an electroconductive adhesive, etc.

Furthermore, the present invention provides an electroconductive paste that has good packing properties and excellent flowability.

Moreover, the present invention provides an electroconductive paste that has excellent shelf life, can be cured in a short time, has excellent short-time drying and curing properties when using an infrared oven (hereinafter, called an IR oven), and is suitable for forming a wiring board circuit, filling a hole, etc.

Furthermore, the present invention provides an electroconductive paste that can give low viscosity and a high degree of packing, and has good heat resistance since the epoxy equivalent is small.

Moreover, the present invention provide an electroconductive paste that has a stable shelf life.

Furthermore, the present invention provides an electroconductive paste that has suppressed spreading during drying after printing.

Moreover, the present invention provides an electroconductive paste that has, in particular, excellent curing properties.

Furthermore, the present invention provides an electroconductive paste that has an excellent shelf life and is suitable as an electroconductive adhesive that enables adhered components to be easily removed.

Moreover, the present invention provides an electroconductive paste that has good electroconductivity and a stable shelf life.

Furthermore, the present invention provides an electroconductive paste that has suppressed spreading during drying after printing, and excellent adhesion and flexibility.

Moreover, the present invention provides an electroconductive paste that has few voids under fast curing conditions using a reflow oven, has excellent adhesion, electroconductivity and printability, and is suitable for mounting a semiconductor device, a passive component, etc.

DISCLOSURE OF INVENTION

The present invention relates to an electroconductive paste comprising a binder and an electroconductive powder containing 80 to 97 wt % of a substantially spherical silver-coated copper powder in which the surface of a copper powder is coated with silver and the surface thereof is further coated with 0.02 to 0.5 wt % relative to the copper powder of a fatty acid, and 3 to 20 wt % of a flat-shaped silver-coated copper powder in which the surface of a copper powder is coated with silver and the surface thereof is further coated with 0.02 to 1.2 wt % relative to the copper powder of a fatty acid.

Furthermore, the present invention relates to an electroconductive paste wherein the substantially spherical silver-coated copper powder has an average particle size of 1 to 10 μm and a tap density of 55% to 75% as a relative value to a true density, and the surface thereof is smoothed.

Moreover, the present invention relates to an electroconductive paste wherein the binder comprises as main components an alkoxy group-containing resol type phenolic resin and an epoxy resin together with a curing agent, an additive, and a solvent therefor.

Furthermore, the present invention relates to an electroconductive paste wherein the epoxy resin has an epoxy equivalent of 130 to 330 g/eq.

Moreover, the present invention relates to an electroconductive paste wherein the alkoxy group-containing resol type phenolic resin has an alkoxy group having 1 to 6 carbons.

Furthermore, the present invention relates to an electroconductive paste wherein the alkoxy group-containing resol type phenolic resin has a degree of alkoxylation of 5% to 95%.

Moreover, the present invention relates to an electroconductive paste wherein the alkoxy group-containing resol type phenolic resin has a weight-average molecular weight of 500 to 200,000.

Furthermore, the present invention relates to an electroconductive paste wherein the alkoxy group-containing resol type phenolic resin and the epoxy resin are present at an alkoxy group-containing resol type phenolic resin:epoxy resin mixing ratio of 5:95 to 60:40 as a ratio by weight.

Moreover, the present invention relates to an electroconductive paste wherein the binder comprises as main components a thermoplastic resin together with an additive and a solvent.

Furthermore, the present invention relates to an electroconductive paste wherein the thermoplastic resin is a thermoplastic resin having a softening temperature of 90° C. to 240° C.

Moreover, the present invention relates to an electroconductive paste wherein the thermoplastic resin is a phenoxy resin.

Furthermore, the present invention relates to an electroconductive paste wherein the binder comprises as main components an epoxy resin together with a curing agent.

BEST MODE FOR CARRYING OUT THE INVENTION

The electroconductive paste of the present invention comprises a binder and an electroconductive powder containing 80 to 97 wt % of a substantially spherical silver-coated copper powder in which the surface of a copper powder is coated with silver and the surface thereof is further coated with 0.02 to 0.5 wt % relative to the copper powder of a fatty acid, and 3 to 20 wt % of a flat-shaped silver-coated copper powder in which the surface of a copper powder is coated with silver and the surface thereof is further coated with 0.02 to 1.2 wt % relative to the copper powder of a fatty acid.

With regard to the substantially spherical silver-coated copper powder, the amount of silver with which the surface of the copper powder is coated is not particularly limited, but it is preferably in the range of 2.5 to 12 wt % relative to the copper powder, and more preferably in the range of 2.5 to 7.5 wt %. When the amount of silver coating exceeds 12 wt %, the degree of aggregation during a silver coating step increases, the tap density tends to decrease and the cost increases. When it is less than 2.5 wt %, the degree of copper exposed increases, and the reliability of the electroconductivity tends to be degraded easily.

The average particle size of the substantially spherical silver-coated copper powder used in the present invention is preferably in the range of 1 to 10 μm from the viewpoint of handling during printing and discharge, etc., and the cost, and is more preferably in the range of 2 to 7 μm.

Furthermore, the aspect ratio of the substantially spherical silver-coated copper powder is preferably in the range of 1 to 1.5, and more preferably in the range of 1 to 1.3.

On the other hand, with regard to the flat-shaped silver-coated copper powder, the amount of silver with which the surface of the copper powder is coated is not particularly limited, but it is preferably in the range of 3 to 12 wt % relative to the copper powder, and more preferably in the range of 3 to 10 wt %. When the amount of silver coating exceeds 12 wt %, the cost tends to increase. When it is less than 3 wt %, the reliability of the electroconductivity tends to be low.

The average particle size of the flat-shaped silver-coated copper powder used in the present invention is preferably no more than 10 μm from the viewpoint of preventing peel-off or damage of the silver coating layer on the surface when preparing the flat-shaped silver-coated copper powder, and is more preferably in the range of 6.5 to 9 μm.

Furthermore, the aspect ratio of the flat-shaped silver-coated copper powder is preferably in the range of 2 to 20, and more preferably in the range of 2 to 15.

The average particle size referred to here is a value measured using a laser scattering type particle size distribution analyzer. In the present invention, a Mastersizer (manufactured by Malvern Instruments) is used as the analyzer.

The aspect ratio referred to in the present invention denotes the ratio (major axis/minor axis) of the major axis to the minor axis of the substantially spherical silver-coated copper powder. In the present invention, the substantially spherical silver-coated copper powder particles are mixed well in a curable resin having low viscosity, the mixture is allowed to stand so that the particles settle and at the same time the resin is cured in that state, the cured substance thus obtained is sectioned in the vertical direction, the shape of particles appearing in the section is inspected by an electron microscope, the major axis/minor axis of each particle for at least 100 particles is measured, and the average value thereof is defined as the aspect ratio.

The minor axis referred to here is the distance between two parallel lines having the shortest distance among pairs of parallel lines that are selected so as to sandwich the particle appearing in the above-mentioned section and be tangential to the outside of the particle. The major axis referred to here is the distance of two parallel lines having the longest distance among pairs of parallel lines that are orthogonal to the parallel lines defining the minor axis and are tangential to the outside of the particle. The rectangle formed by these four lines has a size within which the particle is just contained.

Specific methods employed in the present invention will be explained below.

In the present invention, a method for coating the surface of the copper powder with silver is not particularly limited; there are methods such as, for example, displacement plating, electroplating, and electroless plating, and displacement plating is preferable since the adhesion between the copper powder and silver is strong and the running cost is low.

In the present invention, the surface of the silver-coated copper powder in which the surface of the copper powder is coated with silver is further coated with a fatty acid. Examples of the fatty acid used in the present invention include a saturated fatty acid such as stearic acid, lauric acid, capric acid, or palmitic acid, and an unsaturated fatty acid such as oleic acid, linoleic acid, linolenic acid, or sorbic acid.

The amount of fatty acid with which the surface of the silver-coated copper powder is coated is in the range of 0.02 to 0.5 wt % relative to the copper powder when the shape thereof is substantially spherical, preferably in the range of 0.02 to 0.2 wt %, and more preferably in the range of 0.02 to 0.1 wt %. When it exceeds 0.5 wt %, the aggregated silver-coated copper powder particles can be easily dispersed, and the silver-coated copper powder can be easily wetted by a resin solution, but since the fatty acid functions as an internal mold release agent, the adhesion is degraded. When the amount of fatty acid coating is less than 0.02 wt %, it is difficult to disperse the aggregated silver-coated copper powder particles.

When the shape of the silver-coated copper powder is flat, the amount of fatty acid coating is in the range of 0.02 to 1.2 wt % relative to the copper powder, preferably in the range of 0.08 to 1.0 wt %, and more preferably in the range of 0.15 to 0.7 wt %. When it exceeds 1.2 wt %, although the flat-shaped silver-coated copper powder can be easily wetted by a resin solution, since the fatty acid functions as an internal mold release agent, when it is used as an adhesive, the adhesion is degraded. When it is less than 0.02 wt %, it is difficult to process into a flat shape.

Coating the surface of the silver-coated copper powder with the fatty acid has the following advantages. That is, when the copper powder is subjected to silver plating, the moisture contained in the copper powder is dried in a subsequent drying step. During this step, if the moisture is dried directly, since the latent heat of evaporation of water is large, it takes a long time to dry. However, when the moisture is replaced in advance with a hydrophilic organic solvent such as an alcohol or acetone, this organic solvent can be easily dried. The present invention utilizes this effect, and by mixing the fatty acid with the organic solvent so as to make drying easy and by setting the amount of fatty acid coating in the above-mentioned range, the aggregated silver-coated copper powder particles are easily dispersed, a substantially spherical silver-coated copper powder having no problem with adhesion and having a high tap density can be obtained, and a flat-shaped silver-coated copper powder that can be easily wetted by a resin solution and has no problem with adhesion can also be obtained.

In the present invention, with regard to the electroconductive powders, the above-mentioned substantially spherical silver-coated copper powder and flat-shaped silver-coated copper powder are used.

With regard to the mixing proportions of the substantially spherical silver-coated copper powder and the flat-shaped silver-coated copper powder, the substantially spherical silver-coated copper powder is 80 to 97 wt % and the flat-shaped silver-coated copper powder is 3 to 20 wt %, and the substantially spherical silver-coated copper powder is preferably 85 to 97 wt % and the flat-shaped silver-coated copper powder is preferably 3 to 15 wt %. When the substantially spherical silver-coated copper powder is less than 80 wt % and the flat-shaped silver-coated copper powder exceeds 20 wt %, there is the problem that the reliability of the electroconductivity might be degraded, and when the substantially spherical silver-coated copper powder exceeds 97 wt % and the flat-shaped silver-coated copper powder is less than 3 wt %, there is the problem that the reliability of the electroconductivity might be degraded.

The substantially spherical silver-coated copper powder preferably has a tap density in the range of 55 to 75% as a relative value, and more preferably in the range of 58 to 75%. When the tap density is less than 55%, since the packing density is low, if the mixing proportion of the electroconductive powder is increased, the viscosity of the electroconductive paste increases, whereas if the mixing proportion of the electroconductive powder is decreased, the electroconductivity and the reliability tend to be insufficient. Although a silver-coated copper powder can be obtained by subjecting a copper powder to silver plating, the surface of the silver-coated copper powder that has only been plated has microscopic silver crystals precipitated thereon and is not smooth, and the flowability between particles also tends to be degraded. Furthermore, since there are particle boundaries between the microscopic silver crystals, the electroconductivity of the silver plating layer itself can be low in some cases. Moreover, when silver plating is carried out, the adhesion between the silver plating layer and the copper powder as a core material might not be sufficient. On the other hand, the substantially spherical silver-coated copper powder having a tap density that exceeds the upper limit of 75% becomes difficult to prepare.

Furthermore, the tap density of the flat-shaped spherical silver-coated copper powder is preferably in the range of 27% to 50% as a relative value, and more preferably in the range of 30% to 45%. When the tap density is less than 27%, if it is used in combination with the substantially spherical silver-coated copper powder, since the packing density is lowered, the flowability tends to decrease. On the other hand, when the tap density exceeds 50%, the shape is closer to a sphere, and the effect in improving the contact between the substantially spherical silver-coated copper powder particles tends to be low.

The relative value of the tap density referred to here is a value obtained by carrying out tapping with a stroke of 25 mm 1000 times, calculating the tap density from the volume and the weight, and dividing it by the true density or the theoretical density of the particles.

Preferred examples of the binder used in the present invention include one comprising as main components an alkoxy group-containing resol type phenolic resin and an epoxy resin, together with a curing agent therefor, an additive, and a solvent, one comprising as main components a thermoplastic resin, together with an additive, and a solvent, and one comprising as main components an epoxy resin, together with a curing agent.

An electroconductive paste employing a phenolic resin gives a higher electroconductivity than that of an electroconductive paste employing an epoxy resin alone. This is because since the amount of shrinkage due to curing of the phenolic resin is larger than that of the epoxy resin, the decrease in volume of the electroconductor is large, and the contact area and the probability of contact between the electroconductive powder particles are large. It is essential for an electroconductive paste where high electroconductivity is required to contain a phenolic resin, but the viscosity of the electroconductive paste easily increases, and it is difficult to increase the mixing proportion of the electroconductive powder; however, use of the alkoxy group-containing resol type phenolic resin can eliminate these problems.

Even when the alkoxy group-containing resol type phenolic resin is mixed with the substantially spherical silver-coated copper powder on which copper is exposed, since methylol groups of the phenolic resin are masked with alkoxy groups, it is possible to suppress the reaction between the copper surface and the methylol groups.

On the other hand, since the epoxy resin has excellent mechanical properties, heat resistance, and adhesion, it is suitable as a binder in an adhesive, etc. However, when an imidazole alone is used as a curing agent, if the curability is increased, a dark reaction at room temperature cannot be prevented, and the shelf life is inevitably shortened. However, when the above-mentioned alkoxy group-containing resol type phenolic resin and an imidazole are used in combination as curing agents for the epoxy resin, an electroconductive paste having a long shelf life and excellent curing properties at around 160° C. can be obtained.

When there is a need for replacing a component adhered to a printed wiring board, an electroconductive adhesive (electroconductive paste) obtained using a thermoplastic resin has the effect of enabling the adhered component to be more easily replaced than one adhered using an alkoxy group-containing resol type phenolic resin and an epoxy resin.

An electroconductive paste obtained using a epoxy resin, when it is applied for use of mounting a semiconductor device, a passive component, etc. on a substrate, can exhibit a specific volume resistivity and adhesion because of voids are rarely formed under fast curing conditions using a reflow oven. Furthermore they are electroconductive pastes that have the adhesion required for a material for connecting a semiconductor device, a passive component, etc., they can be used in a printing step of a production process in which a solder paste has conventionally been used, and they have adequate characteristics as solder substitutes.

A solvent can be used in order to adjust the viscosity and control the workability during printing, discharge, etc. When the boiling point of the solvent is low, the viscosity changes greatly while working, which is undesirable, and when the boiling point thereof is too high, the drying properties are poor and problems are caused in curing and drying processes. It is preferable to use a solvent having a boiling point at atmospheric pressure of 150° C. to 250° C., and more preferably 170° C. to 240° C. Examples of the solvents that satisfy the above-mentioned requirements include ethyl carbitol, dipropylene glycol methyl ether, dipropylene glycol ethyl ether, dipropylene glycol isopropyl methyl ether, dipropylene glycol isopropyl ethyl ether, tripropylene glycol methyl ether, propylene glycol ethyl ether acetate, ethylene glycol ethyl ether acetate, ethylene glycol butyl ether, diethylene glycol methyl ether, diethylene glycol ethyl ether, 3-methyl-3-methoxybutanol, 3-methyl-3-methoxy butyl ether, and butyl lactate.

The epoxy resin used in the present invention is preferably liquid at room temperature. A crystalline epoxy resin that crystallizes at room temperature can also be used as long as crystallization can be prevented by mixing it with a liquid substance. The epoxy resin that is liquid at room temperature referred to in the present invention includes, for example, one that is solid at room temperature, but is converted into a liquid stably by mixing it with an epoxy resin that is liquid at room temperature. The room temperature referred to in the present invention means a temperature of about 25° C.

The epoxy resin used preferably has an epoxy equivalent in the range of 130 to 330 g/eq, and more preferably in the range of 160 to 250 g/eq.

A known epoxy resin such as a compound having at least two epoxy groups in the molecule is used, and examples thereof include an aliphatic epoxy resin such as polyglycidyl ether, dihydroxynaphthalene diglycidyl ether, butanediol diglycidyl ether or neopentyl glycol diglycidyl ether obtained by reaction of bisphenol A, bisphenol AD, bisphenol F, novolac, or cresol novolac with epichlorohydrin; a heterocyclic epoxy such as diglycidyl hydantoin; and an alicyclic epoxy resin such as vinylcyclohexene dioxide, dicyclopentanediene dioxide, or an alicyclic diepoxy adipate.

A flexibility imparting agent is added as necessary. A known flexibility imparting agent such as a compound having only one epoxy group in the molecule may be used. Examples thereof include ordinary epoxy resins such as n-butyl glycidyl ether, glycidyl versatate, styrene oxide, ethylhexyl glycidyl ether, phenyl glycidyl ether, cresyl glycidyl ether, and butylphenyl glycidyl ether.

These epoxy resins and flexibility imparting agents can be used singly or in a combination of two or more types.

By using in combination the alkoxy group-containing resol type phenolic resin and a conventionally used curing agent, as described above, the shelf life increases, the curing properties become excellent, and the solvent resistance of a cured electroconductive paste material improves. In particular, by the use or combined use of curing agents having different melting points and dissociation temperatures, the semi-cured state of an electroconductive paste can be controlled, which is preferable. With regard to the curing agents, imidazoles are preferable from the viewpoint of the pot life; examples of other curing agents include amines such as menthenediamine, isophoronediamine, metaphenylenediamine, diaminodiphenylmethane, diaminodiphenylsulfone, and methylenedianiline, acid anhydrides such as phthalic anhydride, trimellitic anhydride, pyromellitic anhydride, succinic anhydride, and tetrahydrophthalic anhydride, and dicyandiamide; a curing agent such as a latent amine curing agent may be used in combination as necessary; and a compound such as tertiary amine, triphenylphosphine, or tetraphenylphosphenyl borate may be added.

The content of such a curing agent is preferably in the range of 0.1 to 20 parts by weight relative to 100 parts by weight of the epoxy resin from the viewpoint of the glass transition temperature (Tg) of the cured electroconductive paste material, and is more preferably in the range of 1 to 10 parts by weight.

The number of carbons of the alkoxy group of the alkoxy group-containing resol type phenolic resin is preferably 1 to 6 from the viewpoint of the viscosity and the electroconductivity when used as a binder of the electroconductive paste, and is more preferably 2 to 4.

Furthermore, the degree of alkoxylation of the resol type phenolic resin, that is, the percentage of alkoxylated methylol groups relative to the total amount of methylol groups, is preferably in the range of 5% to 95% from the viewpoint of the viscosity, the electroconductivity, and the reliability of the electroconductive paste, and is more preferably in the range of 10% to 85%.

Moreover, the number of alkoxy groups in the alkoxy group-containing resol type phenolic resin is preferably in the range of 0.1 to 2 per benzene ring, more preferably in the range of 0.3 to 1.5, and yet more preferably in the range of 0.5 to 1.2.

The degree of alkoxylation or the number of alkoxy groups can be measured by a nuclear magnetic resonance spectroscopic method (hereinafter, called an NMR method).

The weight-average molecular weight of the alkoxy group-containing resol type phenolic resin of the present invention is preferably in the range of 500 to 200,000 from the viewpoint of the viscosity of the electroconductive paste, the shelf life, the curing properties of the electroconductive paste, the electroconductivity, the adhesion, the toughness, etc., and is more preferably in the range of 500 to 120,000.

The weight-average molecular weight can be measured by a gel permeation chromatographic method and calculated using polystyrene as a standard.

The mixing ratio of the alkoxy group-containing resol type phenolic resin and the epoxy resin is preferably 5:95 to 60:40 as an alkoxy group-containing resol type phenolic resin:epoxy resin ratio by weight, and more preferably 10:90 to 40:60. When the proportion of the alkoxy group-containing resol type phenolic resin is less than the above-mentioned range, the function as a curing agent is degraded, and the electroconductivity tends to be poor. When it exceeds the above-mentioned range, although the electroconductivity of the electroconductive paste is high, the balance between the adhesion, the toughness, the viscosity, etc. tends to be poor.

The thermoplastic resin preferably has a softening temperature of 90° C. to 240° C., and more preferably 130° C. to 200° C. Examples thereof include a phenoxy resin, a thermoplastic polyester resin, and a polystyrene resin, and it is preferable to use, among these, a phenoxy resin having a softening temperature of 90° C. to 240° C. since excellent mechanical strength, heat resistance, and adhesion can be obtained. When mixed with the substantially spherical silver-coated copper powder on which copper is exposed, the thermoplastic resin enables a reaction between the copper surface and a functional group to be suppressed. Furthermore, use of the thermoplastic resin can provide an electroconductive paste that has a long shelf life and can be dried readily at around 100° C. to 160° C.

The binder used in the present invention can be obtained by adding as necessary to the above-mentioned materials a coupling agent (additive) such as a silane coupling agent, a titanate coupling agent, an aluminate coupling agent, etc., a thixotropic agent, an antifoaming agent, a powder surface treating agent, a precipitation inhibitor, etc., and mixing uniformly. The contents of the coupling agent, the thixotropic agent, the antifoaming agent, the powder surface treating agent, the precipitation inhibitor, etc., which are added as necessary, are preferably in the range of 0.01 to 1 wt % relative to the electroconductive paste, and more preferably in the range of 0.03 to 0.5 wt %.

The electroconductive paste of the present invention can be obtained by uniformly mixing and dispersing the binder and the electroconductive powder, together with the coupling agent, thixotropic agent, antifoaming agent, powder surface treating agent, precipitation inhibitor, solvent, etc., which are added as necessary, in a mortar and pestle machine, a kneader, a three roll mill, etc.

In the present invention, the mixing ratio of the binder and the electroconductive powder is preferably 3:97 to 40:60 as a binder:electroconductive powder ratio by weight, and more preferably 10:90 to 25:75. When the proportion of the binder is less than the above mentioned range, the viscosity tends to be high. When it exceeds the above mentioned range, the electroconductivity tends to poor.

The electroconductive paste of the present invention has excellent electroconductivity reliability and migration resistance and is suitable for use in solder electrode formation, an electroconductive adhesive, etc.

Furthermore, the electroconductive paste of the present invention has good packing properties and excellent flowability.

Moreover, the electroconductive paste of the present invention has excellent shelf life has excellent short-time drying and curing properties when using an IR oven.

Furthermore, the electroconductive paste of the present invention can give low viscosity and a high degree of packing, and has good heat resistance since the epoxy equivalent is small.

Moreover, the electroconductive of the present invention paste that has a stable shelf life.

Furthermore, the electroconductive paste of the present invention has suppressed spreading during drying after printing.

Moreover, the electroconductive paste of the present invention has excellent curing properties.

Furthermore, the electroconductive paste of the present invention has an excellent shelf life and is suitable as an electroconductive adhesive that enables adhered components to be easily removed.

Moreover, the electroconductive paste of the present invention has good electroconductivity and a stable shelf life.

Furthermore, the electroconductive paste of the present invention has suppressed spreading during drying after printing, and excellent adhesion and flexibility.

Moreover, the electroconductive paste of the present invention has few voids under fast curing conditions using a reflow oven, has excellent adhesion, electroconductivity and printability, and is suitable for mounting a semiconductor device, a passive component, etc.

EXAMPLES

The present invention is explained below by means of Examples.

Example 1

38 parts by weight of an alkoxy group-containing resol type phenolic resin (a trial product of the applicant, number of carbons of the alkoxy group 4, degree of alkoxylation 65%, weight-average molecular weight 1,200), 57 parts by weight of a bisphenol F type epoxy resin having an epoxy equivalent of 170 g/eq (product name Epomik R110, manufactured by Mitsui Chemical Co., Ltd.), and 5 parts by weight of 2-phenyl-4-methylimidazole (product name Curezol 2P4MZ, manufactured by Shikoku Corp.) were uniformly mixed to give a binder.

The ratio by weight of the alkoxy group-containing resol type phenolic resin to the bisphenol F type epoxy resin(phenolic resin:epoxy resin) was 40:60.

A spherical copper powder, prepared by an atomization method, having an average particle size of 5.1 μm (product name SFR-Cu, manufactured by Nippon Atomized Metal Powders Corporation) was washed with dilute hydrochloric acid and pure water, then subjected to replacement plating using a plating solution containing 80 g of AgCN and 75 g of NaCN per L of water so that the amount of silver coating was 3 wt % relative to the spherical copper powder, it was washed with water, and dried to give a silver-plated copper powder (a silver-coated copper powder). During the above-mentioned drying, the moisture was replaced with ethanol three times. In particular, the ethanol used for the third treatment had dissolved therein 0.5 g of stearic acid per kg of the copper powder (corresponding to a coating amount of 0.05 wt % relative to the copper powder), this ethanol having stearic acid dissolved therein was used for replacing the moisture contained in the above silver-plated copper powder, and following this drying was carried out to give a stearic acid-treated silver-plated copper powder.

Subsequently, a 2 L ball mill vessel was charged with 250 g of the stearic acid-treated silver-plated copper powder and 2 kg of zirconia balls having a diameter of 3 mm, and rotated for 3 hours to give a dispersed and surface-smoothed substantially spherical silver-coated copper powder having an average aspect ratio of 1.1 and an average particle size of 5.1 μm.

The tap density of the substantially spherical silver-coated copper powder was 65% as a relative value.

A spherical copper powder of the same type as above was subjected to the same treatments to give a stearic acid-treated silver-plated copper powder so that the amount of silver coating relative to the spherical copper powder (hereinafter, simply called the amount of silver coating) was 12 wt % and the amount of stearic acid coating relative to the spherical copper powder (hereinafter, simply called the amount of stearic acid coating) was 0.2 wt %.

Subsequently, a 2 L ball mill vessel was charged with 250 g of the stearic acid-treated silver-plated copper powder and 2 kg of zirconia balls having a diameter of 5 mm, and shaken for 2 hours to give a flat-shaped silver-coated copper powder having an average aspect ratio of 3.1 and an average particle size of 7.3 μm.

The tap density of the flat-shaped silver-coated copper powder was 38% as a relative value.

50 g of the binder so obtained, 436.5 g of the substantially spherical silver-coated copper powder, 13.5 g of the flat-shaped silver-coated copper powder, and 15 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 97 wt % and the flat-shaped silver-coated copper powder was 3 wt %.

The ratio by weight of the binder to the electroconductive powder was 10:90 (binder:electroconductive powder).

Figure 3:
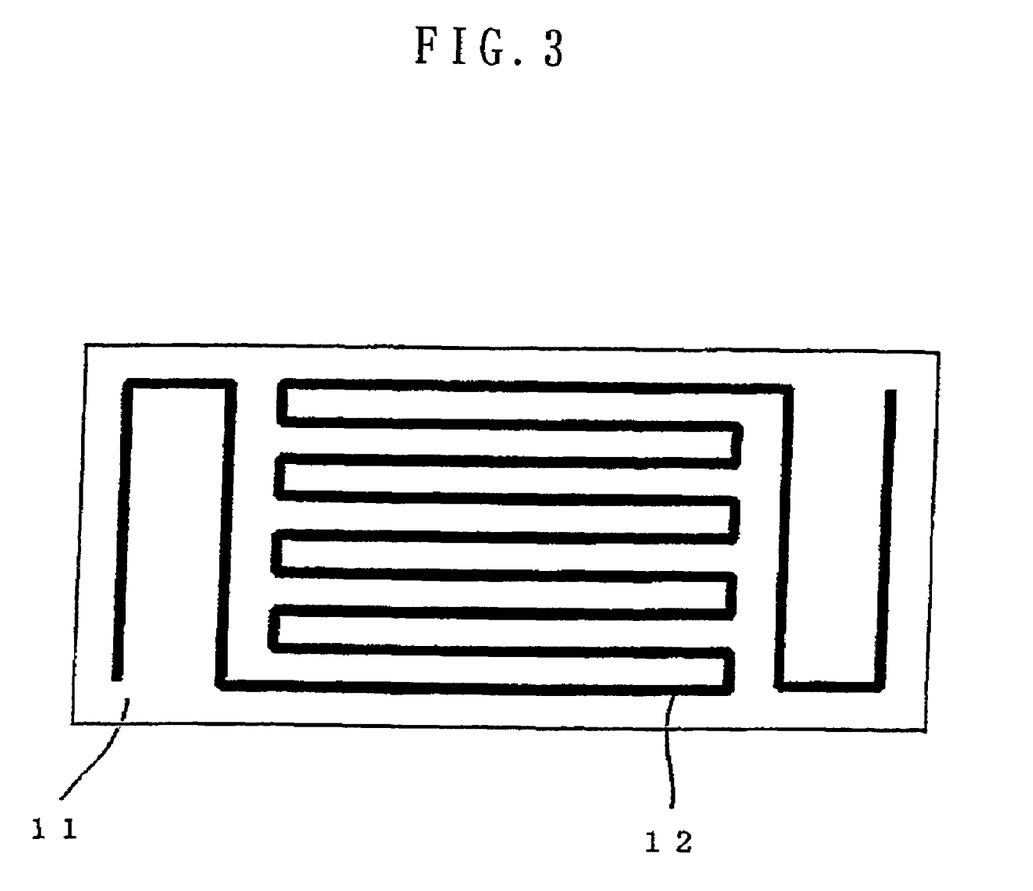
FIG. 3 is a top view showing a state in which a test pattern is formed on a polyimide film.

The electroconductive paste thus obtained was used to print a test pattern 12 on a polyimide film 11 shown in FIG. 3, it was heated in an oven up to 170° C. over 13 minutes, and kept at that temperature for 1 hour to give a wiring board.

The wiring board thus obtained was subjected to a pencil scratch test in accordance with JIS K5401-69 in order to evaluate the curing properties of the electroconductive paste, and gave a result of 6H. The sheet resistance of the conductor was 112 mΩ/□.

A test pattern was also printed on the surface of a 1.2 mm thick glass composite substrate having a copper foil thereon etched out, and cured by heating under the same conditions as above to give a test substrate. This test substrate was subjected to reliability tests, that is, 4,000 hours of a constant temperature and constant humidity test and 3,000 cycles of a gas phase cooling and heating test, and the percentage changes in the circuit resistance were 17.4% and 30.2% respectively. The constant temperature and constant humidity test involved storing at 85° C. and 85% RH, and one cycle of the gas phase cooling and heating test comprised −65° C. for 30 minutes to 125° C. for 30 minutes (the same applies below).

The aspect ratio in this example was specifically measured as follows. 8 g of a low viscosity epoxy resin main agent (No. 10-8130) and 2 g of a curing agent (No. 10-8132) (manufactured by Buehler) were mixed, 2 g of the electroconductive powder was added to this mixture, dispersed well, degassed in vacuum at 30° C. as it was, and then allowed to stand at 30° C. for 10 hours so as to make particles settle and be cured. Subsequently, the cured material thus obtained was sectioned in the vertical direction, the cross section was magnified by 1000 times in an electron microscope, the ratio of the major axis to the minor axis was measured for 150 particles appearing in the cross section, and the average value thereof was defined as the aspect ratio.

Example 2

19 parts by weight of an alkoxy group-containing resol type phenolic resin, 76 parts by weight of a bisphenol F type epoxy resin, and 5 parts by weight of 2-phenyl-4-methylimidazole, all of which were the same as those used in Example 1, were uniformly mixed to give a binder.

The ratio by weight of the alkoxy group-containing resol type phenolic resin to the bisphenol F type epoxy resin was 20:80 (phenolic resin:epoxy resin).

50 g of the binder so obtained, 427.5 g of the substantially spherical silver-coated copper powder obtained in Example 1, 22.5 g of a flat-shaped silver-coated copper powder having an average aspect ratio of 3 and an average particle size of 6.8 µm obtained by the same process as in Example 1 from a stearic acid-treated silver-plated copper powder having an amount of silver coating of 5 wt % and an amount of stearic acid coating of 0.5 wt % obtained by the same process as in Example 1, and 10 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 95 wt % and the flat-shaped silver-coated copper powder was 5 wt %.

The tap density of the flat-shaped silver-coated copper powder was 41% as a relative value.

Furthermore, the ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 6H, and the sheet resistance of the conductor was 121 mΩ/□.

A test substrate was fabricated by the same process as in Example 1 and subjected to reliability tests, that is, 4,000 hours of the constant temperature and constant humidity test and 3,000 cycles of the gas phase cooling and heating test, and the percentage changes in the circuit resistance were 16.2% and 28.9%, respectively.

Example 3

4.75 parts by weight of an alkoxy group-containing resol type phenolic resin (a trial product of the applicant, number of carbons of the alkoxy group 4, degree of alkoxylation 65%, weight-average molecular weight 20,000), 90.25 parts by weight of the bisphenol F type epoxy resin used in Example 1, and 5 parts by weight of the 2-phenyl-4-methylimidazole used in Example 1 were mixed uniformly to give a binder.

The ratio by weight of the alkoxy group-containing resol type phenolic resin to the bisphenol F type epoxy resin was 5:95 (phenolic resin:F type epoxy resin).

50 g of the binder so obtained, 436.5 g of a dispersed and surface-smoothed substantially spherical silver-coated copper powder having an average aspect ratio of 1.1 and an average particle size of 5.5 µm obtained by the same process as in Example 1 from a stearic acid-treated silver-plated copper powder having an amount of silver coating of 5 wt % and an amount of stearic acid coating of 0.1 wt % obtained by the same process as in Example 1, 13.5 g of the flat-shaped silver-coated copper powder obtained in Example 2, and 13 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 97 wt % and the flat-shaped silver-coated copper powder was 3 wt %.

The tap density of the substantially spherical silver-coated copper powder was 62% as a relative value.

Furthermore, the ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 6H, and the sheet resistance of the conductor was 156 mΩ/□.

A test substrate was fabricated by the same process as in Example 1 and subjected to reliability tests, that is, 4,000 hours of the constant temperature and constant humidity test and 3,000 cycles of the gas phase cooling and heating test, and the percentage changes in the circuit resistance were 15.8% and 40.2%, respectively.

Example 4

4.75 parts by weight of the alkoxy group-containing resol type phenolic resin used in Example 3, 90.25 parts by weight of the bisphenol F type epoxy resin used in Example 1, and 5 parts by weight of the 2-phenyl-4-methylimidazole used in Example 1 were mixed uniformly to give a binder.

The ratio by weight of the alkoxy group-containing resol type phenolic resin to the bisphenol F type epoxy resin was 5:95 (phenolic resin:epoxy resin).

50 g of the binder so obtained, 382.5 g of a dispersed and surface-smoothed substantially spherical silver-coated copper powder having an average aspect ratio of 1.1 and an average particle size of 5.5 µm obtained by the same process as in Example 1 from a stearic acid-treated silver-plated copper powder having an amount of silver coating of 12 wt % and an amount of stearic acid coating of 0.15 wt % obtained by the same process as in Example 1, 67.5 g of a flat-shaped silver-coated copper powder having an amount of silver coating of 3 wt %, an amount of stearic acid coating of 0.5 wt %, an average aspect ratio of 2.2, and an average particle size of 6.2 µm obtained by the same process as in Example 1, and 16 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 85 wt % and the flat-shaped silver-coated copper powder was 15 wt %.

The tap density of the substantially spherical silver-coated copper powder was 59% as a relative value, and the tap density of the flat-shaped silver-coated copper powder was 43% as a relative value.

Furthermore, the ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 6H, and the sheet resistance of the conductor was 124 mΩ/□.

A test substrate was fabricated by the same process as in Example 1 and subjected to reliability tests, that is, 4,000 hours of the constant temperature and constant humidity test and 3,000 cycles of the gas phase cooling and heating test, and the percentage changes in the circuit resistance were 9.3% and 26.7%, respectively.

Comparative Example 1

38 parts by weight of an alkoxy group-containing resol type phenolic resin, 57 parts by weight of a bisphenol F type epoxy resin, and 5 parts by weight of 2-phenyl-4-methylimidazole, all of which were the same as those used in Example 1, were mixed uniformly to give a binder.

The ratio by weight of the alkoxy group-containing resol type phenolic resin to the bisphenol F type epoxy resin was 40:60 (phenolic resin:epoxy resin).

50 g of the binder so obtained, 441 g of a dispersed and surface-smoothed substantially spherical silver-coated copper powder having an average aspect ratio of 1.1 and an average particle size of 5.5 µm obtained by the same process as in Example 1 from a stearic acid-treated silver-plated copper powder having an amount of silver coating of 2 wt % and an amount of stearic acid coating of 0.005 wt % obtained by the same process as in Example 1, 9 g of a flat-shaped silver-coated copper powder having an average aspect ratio of 4.5 and an average particle size of 8.8 µm obtained by the same process as in Example 1 from a stearic acid-treated silver-plated copper powder having an amount of silver coating of 2 wt % and an amount of stearic acid coating of 0.05 wt % obtained by the same process as in Example 1, and 22 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 98 wt % and the flat-shaped silver-coated copper powder was 2 wt %.

The tap density of the substantially spherical silver-coated copper powder was 64% as a relative value, and the tap density of the flat-shaped silver-coated copper powder was 45% as a relative value.

Furthermore, the ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 6H, but the sheet resistance of the conductor was a high value of 294 mΩ/□.

A test substrate was fabricated by the same process as in Example 1 and subjected to reliability tests, that is, 4,000 hours of the constant temperature and constant humidity test and 3,000 cycles of the gas phase cooling and heating test, and the percentage changes in the circuit resistance were high values of 112.8% and 93.3%, respectively.

Comparative Example 2

4.75 parts by weight of an alkoxy group-containing resol type phenolic resin, 90.25 parts by weight of a bisphenol F type epoxy resin, and 5 parts by weight of 2-phenyl-4-methylimidazole, all of which were the same as those used in Example 1, were mixed uniformly to give a binder.

The ratio by weight of the alkoxy group-containing resol type phenolic resin to the bisphenol F type epoxy resin was 5:95 (phenolic resin:epoxy resin).

50 g of the binder so obtained, 360 g of a dispersed and surface-smoothed substantially spherical silver-coated copper powder having an average aspect ratio of 1.1 and an average particle size of 5.5 µm obtained by the same process as in Example 1 from a stearic acid-treated silver-plated copper powder having an amount of silver coating of 2 wt % and an amount of stearic acid coating of 0.6 wt % obtained by the same process as in Example 1, 90 g of a flat-shaped silver-coated copper powder having an average aspect ratio of 2.4 and an average particle size of 6.3 µm obtained by the same process as in Example 1 from a stearic acid-treated silver-plated copper powder having an amount of silver coating of 2 wt % and an amount of stearic acid coating of 2 wt % obtained by the same process as in Example 1, and 21 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 80 wt % and the flat-shaped silver-coated copper powder was 20 wt %.

The tap density of the substantially spherical silver-coated copper powder was 48% as a relative value, and the tap density of the flat-shaped silver-coated copper powder was 43% as a relative value.

Furthermore, the ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 4H, but the sheet resistance of the conductor was a high value of 261 m$\Omega$/□.

A test substrate was fabricated by the same process as in Example 1 and subjected to reliability tests, that is, 4,000 hours of the constant temperature and constant humidity test and 3,000 cycles of the gas phase cooling and heating test, and the percentage changes in the circuit resistance were high values of 125.1% and 103.8%, respectively.

Comparative Example 3

95 parts by weight of the bisphenol F type epoxy resin used in Example 1 and 5 parts by weight of 2-ethyl-4-methylimidazole (product name Curezol 2E4MZ, manufactured by Shikoku Corp.) were mixed uniformly to give a binder.

50 g of the binder so obtained, 360 g of a dispersed and surface-smoothed substantially spherical silver-coated copper powder having an average aspect ratio of 1.1 and an average particle size of 5.5 μm obtained by the same process as in Example 1 from a stearic acid-treated silver-plated copper powder having an amount of silver coating of 12 wt % and an amount of stearic acid coating of 0.15 wt % obtained by the same process as in Example 1, 90 g of a flat-shaped silver-coated copper powder having an average aspect ratio of 6 and an average particle size of 7.3 μm obtained by the same process as in Example 1 from a stearic acid-treated silver-plated copper powder having an amount of silver coating of 12 wt % and an amount of stearic acid coating of 0.2 wt % obtained by the same process as in Example 1, and 20 g of ethyl carbitol as a solvent were mixed and dispersed uniformly in a mortar and pestle machine and a three roll mill to give an electroconductive paste. The shelf life of this electroconductive paste was 2 days when refrigerated, which was extremely poor compared with 60 days for the electroconductive paste obtained in Example 4 when refrigerated.

The proportions of the electroconductive powders (the substantially spherical silver-coated copper powder and the flat-shaped silver-coated copper powder) were such that the substantially spherical silver-coated copper powder was 80 wt % and the flat-shaped silver-coated copper powder was 20 wt %.

The tap density of the substantially spherical silver-coated copper powder was 58% as a relative value, and the tap density of the flat-shaped silver-coated copper powder was 38% as a relative value.

Furthermore, the ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 6H, but the sheet resistance of the conductor was a high value of 389 m$\Omega$/□.

A test substrate was fabricated by the same process as in Example 1 and subjected to reliability tests, that is, 4,000 hours of the constant temperature and constant humidity test and 3,000 cycles of the gas phase cooling and heating test, and the percentage changes in the circuit resistance were high values of 194% and 216%, respectively.

Example 5

50 parts by weight of a phenoxy resin (product name PKHJ, softening temperature 170° C., manufactured by Phenoxy Specialties), 0.4 parts by weight of a titanate coupling agent (product name KR-TTS2, manufactured by Ajinomoto Co., Inc.), and 75 parts by weight of diethylene glycol monoethyl ether (product name EtDG, manufactured by Nippon Nyukazai Co., Ltd.) as a solvent were mixed and dissolved uniformly to give a thermoplastic resin solution, which was used as a binder.

125 g of the binder so obtained, 441 g of the substantially spherical silver-coated copper powder obtained in Example 1, 9 g of the flat-shaped silver-coated copper powder obtained in Example 1, and 10 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 98 wt % and the flat-shaped silver-coated copper powder was 2 wt %.

The ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 6H and the sheet resistance of the conductor was 131 m$\Omega$/□.

When a test substrate was fabricated by the same process as in Example 1, the sheet resistance of the test substrate was 85 m$\Omega$/□. When the test substrate was subjected to reliability tests, that is 4,000 hours of the constant temperature and constant humidity test and 3,000 cycles of the gas phase cooling and heating test, the percentage changes in the circuit resistance were 2.3% and 11.2%, respectively.

A chip resistor was bonded to a copper foil using the electroconductive paste obtained above, the chip resistor was subsequently detached by heating, and it could easily be detached at a temperature of 180° C.

Example 6

125 g of the binder obtained in Example 5, 405 g of the substantially spherical silver-coated copper powder obtained in Example 1, 45 g of the flat-shaped silver-coated copper powder obtained in Example 1, and 10 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 90 wt % and the flat-shaped silver-coated copper powder was 10 wt %.

The ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 4H and the sheet resistance of the conductor was 97 m$\Omega$/□.

When a test substrate was fabricated by the same process as in Example 1, the sheet resistance of the test substrate was 70 mΩ/□. When the test substrate was subjected to reliability tests, that is 4,000 hours of the constant temperature and constant humidity test and 3,000 cycles of the gas phase cooling and heating test, the percentage changes in the circuit resistance were 2.1% and 10.5%, respectively.

Example 7

30 parts by weight of a phenoxy resin, 0.5 parts by weight of a titanate coupling agent, and 85 parts by weight of diethylene glycol monoethyl ether as a solvent, all of which were the same as those used in Example 5, were mixed and dissolved uniformly to give a thermoplastic resin solution, which was used as a binder.

115 g of the binder so obtained, 460.6 g of the substantially spherical silver-coated copper powder obtained in Example 3, 9.4 g of the flat-shaped silver-coated copper powder obtained in Example 1, and 10 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 98 wt % and the flat-shaped silver-coated copper powder was 2 wt %.

The ratio by weight of the binder to the electroconductive powder was 6:94 (binder:electroconductive powder).

A wiring board was fabricated by the same process as in Example 1, the characteristics thereof were evaluated, and it was found that the pencil scratch test for a coating gave a result of 4H and the sheet resistance of the conductor was 107 mΩ/□.

When a test substrate was fabricated by the same process as in Example 1, the sheet resistance of the test substrate was 63 mΩ/□. When the test substrate was subjected to reliability tests, that is 4,000 hours of the constant temperature and constant humidity test and 3,000 cycles of the gas phase cooling and heating test, the percentage changes in the circuit resistance were 5.7% and 13.1%, respectively.

Example 8

70 parts by weight of a phenoxy resin, 0.5 parts by weight of a titanate coupling agent, and 77 parts by weight of diethylene glycol monoethyl ether as a solvent, all of which were the same as those used in Example 5, were mixed and dissolved uniformly to give a thermoplastic resin solution, which was used as a binder.

147 g of the binder so obtained, 344 g of the substantially spherical silver-coated copper powder obtained in Example 4, 86 g of the flat-shaped silver-coated copper powder obtained in Example 4, and 20 g of ethyl carbitol as a solvent were mixed and dispersed uniformly in a mortar and pestle machine and a three roll mill to give an electroconductive paste.

The proportions of the electroconductive powders (the substantially spherical silver-coated copper powder and the flat-shaped silver-coated copper powder) were such that the substantially spherical silver-coated copper powder was 80 wt % and the flat-shaped silver-coated copper powder was 20 wt %.

The ratio by weight of the binder to the electroconductive powder was 14:86 (binder:electroconductive powder).

A wiring board was fabricated by the same process as in Example 1, the characteristics thereof were evaluated, and it was found that the pencil scratch test for a coating gave a result of 3H and the sheet resistance of the conductor was 152 mΩ/□.

When a test substrate was fabricated by the same process as in Example 1, the sheet resistance of the test substrate was 103 mΩ/□. When the test substrate was subjected to reliability tests, that is 4,000 hours of the constant temperature and constant humidity test and 3,000 cycles of the gas phase cooling and heating test, the percentage changes in the circuit resistance were 5.2% and 10.3%, respectively.

Comparative Example 4

125 g of the binder obtained in Example 5, 450 g of the substantially spherical silver-coated copper powder obtained in Comparative Example 1, and 10 g of ethyl carbitol as a solvent were mixed and dispersed uniformly in a mortar and pestle is machine and a three roll mill to give an electroconductive paste.

The ratio by weight of the binder to the electroconductive powder was 10:90 (binder:electroconductive powder).

A wiring board was fabricated by the same process as in Example 1, the characteristics thereof were evaluated, and it was found that the pencil scratch test for a coating gave a result of 5H and the sheet resistance of the conductor was a high value of 198 mΩ/□.

When a test substrate was fabricated by the same process as in Example 1, the sheet resistance of the test substrate was a high value of 211 mΩ/□. When the test substrate was subjected to reliability tests, that is 4,000 hours of the constant temperature and constant humidity test and 3,000 cycles of the gas phase cooling and heating test, the percentage changes in the circuit resistance were high values of 79.5% and 68.7%, respectively.

Comparative Example 5

147 g of the binder obtained in Example 8, 430 g of the substantially spherical silver-coated copper powder obtained in Comparative Example 2, and 20 g of ethyl carbitol as a solvent were mixed and dispersed uniformly in a mortar and pestle machine and a three roll mill to give an electroconductive paste.

The ratio by weight of the binder to the electroconductive powder was 14:86 (binder:the electroconductive powder).

A wiring board was fabricated by the same process as in Example 1, the characteristics thereof were evaluated, and it was found that the pencil scratch test for a coating gave a result of 3H and the sheet resistance of the conductor was a high value of 283 mΩ/□.

When a test substrate was fabricated by the same process as in Example 1, the sheet resistance of the test substrate was a high value of 327 mΩ/□. When the test substrate was subjected to reliability tests, that is 4,000 hours of the constant temperature and constant humidity test and 3,000 cycles of the gas phase cooling and heating test, the percentage changes in the circuit resistance were high values of 119% and 127%, respectively.

Examples 9 to 11 and Comparative Examples 6 and 7

Materials used in Examples 9 to 11 and Comparative Examples 6 and 7 and Comparative Examples were prepared by the following methods or were acquired.

(1) Preparation of Epoxy Resin 10.0 parts by weight of YDF-170 (product name of a bisphenol F type epoxy resin, epoxy equivalent=170, manufactured by Tohto kasei Co., Ltd.) and 10.0 parts by weight of YL-980 (product name of a bisphenol A type epoxy resin, epoxy equivalent=185, manufactured by Japan Epoxy Resins Co., Ltd.) were heated at 80° C., and stirred for 1 hour to give a uniform epoxy resin solution.

(2) Preparation of Binder 20.0 parts by weight of the epoxy resin solution prepared in the above (1), 10.0 parts by weight of PP-101 (product name of an alkylphenyl glycidyl ether, epoxy equivalent=230, manufactured by Tohto kasei Co., Ltd.), and 5.0 parts by weight of 2P4MHZ (product name of an imidazole compound manufactured by Shikoku Corp.) were mixed and kneaded using a three roll mill to give a binder.

The binder prepared in the above (2) and the electroconductive powder used in Example 1 were mixed at the mixing ratio shown in Table 1, kneaded using a three roll mill, and then subjected to degassing at 5 Torr or less for 10 minutes to give a paste-like composition.

The characteristics of the compositions of Examples 9 to 11 and Comparative Examples 6 and 7 were measured by the following methods. The results are summarized in Table 1.

(1) Volume resistivity: the above-mentioned bonding material was formed into a 1×100×0.25 mm shape and heated at a rate of temperature increase of 40° C./min and at 200° C. for 5 min to give a test piece. The resistance R of this test piece was obtained by a four probe method, and the volume resistivity was calculated from R·L/S using a cross section S and a length L.

(2) Adhesion: an Sn-plated copper lead frame was coated with about 0.2 mg of the bonding material, a 2×2 mm copper chip (thickness about 0.25 mm, Ag-plated) was compression-bonded thereto, and the sample was heated at a rate of temperature increase of 40° C./min form 25° C. to 200° C. and at 200° C. for 5 min for completion of bonding. The adhesive shear strength (N) of this sample was measured using a bond tester (manufactured by DAGE) with a clearance of 0.05 mm at a shear rate of 0.5 mm/sec and 25° C.

(3) Fast curing: when the volume resistively was less than $1 \times 10^{-2}$ · cm and the adhesion was higher than 100 N under heating conditions of a rate of temperature increase of 40° C./min and 200° C. for 5 min, it was evaluated as good, and others were evaluated as poor.

(4) Viscosity: 0.4 mL of an electroconductive paste was placed in an EHD model viscometer equipped with a 3 degree cone rotor (manufactured by Tokimec Inc.) and the viscosity was measured at 25° C. and 0.5 rpm.

(5) Printing characteristics: when the viscosity was 200 to 400 Pa·s, it was evaluated as good, and others were evaluated as poor.

TABLE 1

| | | Electroconductive powder | | Volume | | | | |
|---|---|---|---|---|---|---|---|---|
| | Binder | Substantially spherical | Flat-shaped | resistivity ($\Omega \cdot$ cm) | Adhesion (N) | Fast curing | Viscosity (Pa · s) | Printing characteristics |
| Example 9 | A: 25 | 97 | 3 | $1 \times 10^{-3}$ | 123 | Good | 203 | Good |
| Example 10 | A: 25 | 90 | 10 | $5 \times 10^{-4}$ | 109 | Good | 256 | Good |
| Example 11 | A: 25 | 80 | 20 | $3 \times 10^{-4}$ | 101 | Good | 297 | Good |
| Comp. Ex. 6 | A: 25 | 99 | 1 | $5 \times 10^{-3}$ | 134 | Good | 156 | Poor |
| Comp. Ex. 7 | A: 25 | 75 | 25 | $1 \times 10^{-4}$ | 82 | Poor | 355 | Good |

The invention claimed is:

1. An electroconductive paste comprising a binder and an electroconductive powder containing 85 to 98 wt % of a substantially spherical silver-coated copper powder in which the surface of a copper powder is coated with silver and the surface thereof is further coated with 0.02 to 0.2 wt % relative to the copper powder of a fatty acid, and 2 to 15 wt % of a flat-shaped silver-coated copper powder in which the surface of a copper powder is coated with silver and the surface thereof is further coated with 0.08 to 1.0 wt % relative to the copper powder of a fatty acid.

2. The electroconductive paste according to claim 1, wherein the substantially spherical silver-coated copper powder has an average particle size of 1 to 10 μm and a tap density of 55% to 75% as a relative value to a true density, and the surface thereof is smoothed.

3. The electroconductive paste according to claim 1, wherein the binder comprises as main components an alkoxy group-containing resol type phenolic resin and an epoxy resin together with a curing agent, an additive, and a solvent therefor.

4. The electroconductive paste according to claim 3, wherein the epoxy resin has an epoxy equivalent of 130 to 330 g/eq.

5. The electroconductive paste according to claim 3, wherein the alkoxy group-containing resol type phenolic resin has an alkoxy group having 1 to 6 carbons.

6. The electroconductive paste according to claim 3, wherein the alkoxy group-containing resol type phenolic resin has a degree of alkoxylation of 5% to 95%.

7. The electroconductive paste according to claim 3, wherein the alkoxy group-containing resol type phenolic resin has a weight-average molecular weight of 500 to 200,000.

8. The electroconductive paste according to claim 3, wherein the alkoxy group-containing resol type phenolic resin and the epoxy resin are present at an alkoxy group-containing resol type phenolic resin:epoxy resin mixing ratio of 5:95 to 60:40 as a ratio by weight.

9. The electroconductive paste according to claim 1, wherein the binder comprises as main components a thermoplastic resin together with an additive and a solvent.

10. The electroconductive paste according to claim 9, wherein the thermoplastic resin is a thermoplastic resin having a softening temperature of 90° C. to 240° C.

11. The electroconductive paste according to claim 9, wherein the thermoplastic resin is a phenoxy resin.

12. The electroconductive paste according to claim 1, wherein the binder comprises as main components an epoxy resin together with a curing agent.

13. The electroconductive paste according to claim 1, wherein the fatty acid is selected from the group consisting of stearic acid, lauric acid, capric acid, palmitic acid, oleic acid, linoleic acid, linolenic acid and sorbic acid.

14. The electroconductive paste according to claim 1, wherein the surface of the substantially spherical silver-coated copper powder is further coated with 0.02 to 0.1 wt % relative to the copper powder of the fatty acid, and the surface of the flat-shaped silver-coated copper powder is further coated with 0.15 to 0.7 wt % relative to the copper powder of the fatty acid.

15. The electroconductive paste according to claim 1, wherein the fatty acid is stearic acid.

* * * * *